(12) United States Patent
Kobayashi et al.

(10) Patent No.: US 10,103,256 B2
(45) Date of Patent: Oct. 16, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yusuke Kobayashi, Tsukuba (JP); Yuichi Onozawa, Matsumoto (JP); Manabu Takei, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/583,982

(22) Filed: May 1, 2017

(65) Prior Publication Data

US 2017/0236927 A1 Aug. 17, 2017

Related U.S. Application Data

(63) Continuation of application No. PCT/JP2015/084539, filed on Dec. 9, 2015.

(30) Foreign Application Priority Data

Jan. 13, 2015 (JP) .................................. 2015-004051

(51) Int. Cl.
*H01L 29/73* (2006.01)
*H01L 29/06* (2006.01)
(Continued)

(52) U.S. Cl.
CPC ...... *H01L 29/7397* (2013.01); *H01L 29/0619* (2013.01); *H01L 29/0649* (2013.01);
(Continued)

(58) Field of Classification Search
CPC ............. H01L 29/7397; H01L 29/0619; H01L 29/0649; H01L 29/4236; H01L 29/42368; H01L 29/42376; H01L 29/66348
(Continued)

(56) References Cited

U.S. PATENT DOCUMENTS 6,815,769 B2 11/2004 Pfirsch et al.
2002/0179976 A1 12/2002 Takahashi
(Continued)

FOREIGN PATENT DOCUMENTS

JP 2002-353456 A 12/2002
JP 2011-204711 A 10/2011
(Continued)

OTHER PUBLICATIONS

M. Sumitomo, et al., "Low loss IGBT with Partially Narrow Mesa Structure (PNM-IGBT)", pp. 17-20, Proceeding of the 2012 24th International Symposium on Power Semiconductor Devices and ICs (ISPSD'12), Jun. 3-7, 2012, Bruges, Belgium.
(Continued)

*Primary Examiner* — Sheikh Maruf
(74) *Attorney, Agent, or Firm* — Rabin & Berdo, P.C.

(57) ABSTRACT

A semiconductor device, including a first groove, a second groove and a first impurity region provided on a semiconductor substrate, a second impurity region provided in the first impurity region, a gate electrode provided in the first groove, a first insulating film provided between the first groove and the gate electrode, a second insulating film provided in the second groove, and a third insulating film provided astride tops of the first groove and the second groove. Each of the first and second insulating films has a lower half portion that is thicker than an upper half portion thereof. The lower half portions of the first and second insulating films are connected. The gate electrode has first (Continued)

and second portions thereof respectively contacting the lower and upper half portions of the first insulating film, a width of the first portion being narrower than a width of the second portion.

3 Claims, 8 Drawing Sheets

(51) Int. Cl.
*H01L 29/66* (2006.01)
*H01L 29/739* (2006.01)
*H01L 29/423* (2006.01)

(52) U.S. Cl.
CPC .... *H01L 29/4236* (2013.01); *H01L 29/42368* (2013.01); *H01L 29/42376* (2013.01); *H01L 29/66348* (2013.01)

(58) Field of Classification Search
USPC .......................................... 257/139; 438/141
See application file for complete search history.

(56) References Cited

U.S. PATENT DOCUMENTS

| | | | | |
|---|---|---|---|---|
| 2004/0178457 | A1* | 9/2004 | Francis | H01L 29/0839 257/397 |
| 2005/0006700 | A1* | 1/2005 | Cao | H01L 29/0696 257/328 |
| 2005/0263852 | A1* | 12/2005 | Ogura | H01L 29/0834 257/565 |
| 2006/0163650 | A1* | 7/2006 | Ma | H01L 29/0696 257/330 |
| 2008/0265315 | A1* | 10/2008 | Mauder | H01L 29/7813 257/330 |
| 2009/0057713 | A1* | 3/2009 | Hirler | H01L 29/1095 257/143 |
| 2010/0078674 | A1* | 4/2010 | Seok | H01L 29/0696 257/139 |
| 2011/0233607 | A1 | 9/2011 | Yanagisawa et al. | |
| 2012/0292662 | A1* | 11/2012 | Matsuura | H01L 29/66348 257/139 |
| 2013/0026537 | A1 | 1/2013 | Rahimo et al. | |
| 2013/0037853 | A1 | 2/2013 | Onozawa | |
| 2013/0175574 | A1* | 7/2013 | Matsuura | H01L 29/66348 257/139 |
| 2014/0054644 | A1* | 2/2014 | Hikasa | H01L 29/7395 257/139 |
| 2015/0162406 | A1* | 6/2015 | Laven | H01L 29/0696 257/335 |
| 2015/0325687 | A1* | 11/2015 | Baburske | H01L 29/0696 257/139 |

FOREIGN PATENT DOCUMENTS

| | | |
|---|---|---|
| JP | 2013-522924 A | 6/2013 |
| WO | WO-2011/111500 A1 | 9/2011 |

OTHER PUBLICATIONS

N. Tokura, "Influence of Floating P-Base on Turn-On Characteristics of Trench-Gate FS-IGBT", IEEJ Transactions on Industry Applications, vol. 130, No. 6, pp. 728-733, 2010.

Y. Onozawa, et al., "Development of the next generation 1200V trench-gate FS-IGBT featuring lower EMI noise and lower switching loss", pp. 13-16, 2007, Proceeding of the 19th International Symposium on Power Semiconductor Devices & ICs (ISPSD '07), May 27-30, 2007 Jeju, Korea.

M. Tanaka and I. Omura, "Scaling Rule for Very Shallow Trench IGBT toward CMOS Process Compatibility", pp. 177-180, Jun. 2012, Proceeding of the 2012 24th International Symposium on Power Semiconductor Devices and ICs (ISPSD '12).

M. Yamaguchi et al., "IEGT Design Criterion for Reducing EMI Noise", Proceeding of 2004 International Symposium on Power Semiconductor Devices & ICs, Kitakyushu, pp. 115-118.

* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/084539 filed on Dec. 9, 2015 which claims priority from a Japanese Patent Application No. 2015-004051 filed on Jan. 13, 2015, the contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Among power semiconductor devices are insulated gate bipolar transistors (IGBTs). IGBTs, for example, may be rated for 400V, 600V, 1200V, 1700V, 3300V, or higher voltages; and for example, are used in power conversion equipment such as converters, inverters, and the like.

Power semiconductor devices have to have low loss and high efficiency while at the same time, low noise (i.e. to have electromagnetic compatibility (EMC)). EMC is dependent on the rate of voltage change over time (dV/dt). For example, during inverter operation, the dV/dt is the most apt to increase at the time of low current of the turn-on diode. Therefore, the dV/dt at the time of turn-ON has to be reduced to a suitable value by increasing gate resistance (Rg) and reducing switching speed. However, when the dV/dt at the time of turn-ON is reduced, turn-ON loss (Eon) of the IGBT increases. Thus, improvement of this Eon-dV/dt tradeoff and improvement of the controllability of the dV/dt at the time of turn-ON by Rg is important.

On the other hand, to reduce IGBT loss, the tradeoff relationship (Von-Eoff tradeoff) between the ON voltage Von and the turn-OFF loss Eoff of the IGBT has to be improved. Improving the injection enhancement (IE) effect is known as an effective method of improving this tradeoff relationship. For example, a structure that enhances the IE effect by increasing the thickness of an oxide film on a trench bottom has been reported (for example, refer to M. Sumitomo, et al., Proceedings of IEEE 24th International Symposium on Power Semiconductor Devices and ICs (ISPSD), pp. 17-20, 2012).

Further, by increasing the capacitance between a gate and a source (gate-source capacitance) Cgs, an effect of suppressing ringing may be expected. However, when Cgs is increased excessively, the gate current for switching increases. Therefore, it is preferable that the Cgs be easily adjustable according to application.

A structure has been reported in which in an IGBT having a trench gate structure, a floating p layer in which no channel occurs is provided between adjacent trenches (for example, refer to N. Tokura, IEEJ Transactions on Industry Applications, Vol. 130, No. 6, pp. 728-733, 2010, and Y. Onozawa, et al., ISPSD '07, pp. 13-16, 2007). A structure has been further reported in which in a trench gate IGBT having a floating p layer, a mesa portion between adjacent trenches and in which a channel occurs is reduced in size, thereby enhancing the IE effect (for example, refer to M. Tanaka and I. Omura, ISPSD '12, pp. 177-180, 2012).

Figure 9:
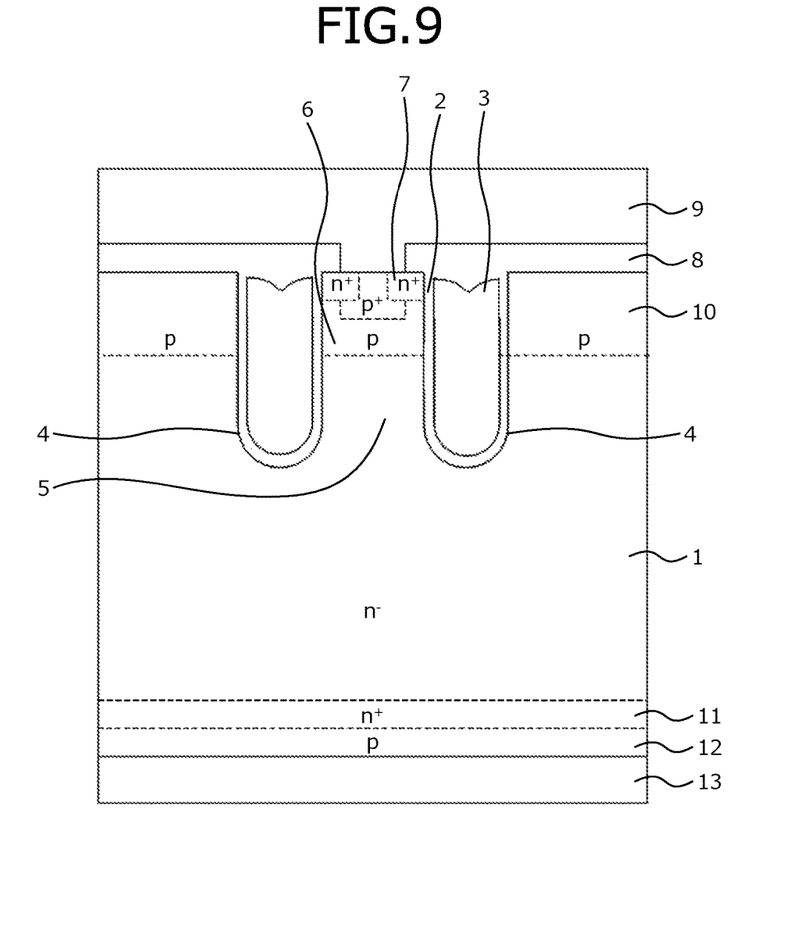
FIG. 9 is a cross-sectional view of an active portion of a conventional trench gate IGBT.

FIG. 9 is a cross-sectional view of an active portion of a conventional trench gate IGBT. The active portion is a portion responsible for current driving. As depicted in FIG. 9, a trench-type MOS (metal-oxide-semiconductor) channel is formed on a front surface side of an $n^-$-type semiconductor substrate 1. A gate oxide film 2 and a gate electrode 3 are provided in a trench 4. A p-type layer 6 in which a channel occurs is provided in a mesa portion 5 between adjacent trenches 4.

An $n^+$-type layer 7 is provided in a surface region of the p-type layer 6. The front surface side of the $n^-$-type semiconductor substrate 1 is covered by an interlayer insulating film 8. An emitter electrode 9 is provided on the interlayer insulating film 8, contacts the p-type layer 6 and the $n^+$-type layer 7 through a contact hole, and is electrically connected to the p-type layer 6 and the $n^+$-type layer 7.

To secure the breakdown voltage, on the front surface side of the $n^-$-type semiconductor substrate 1, at a portion facing the mesa portion 5 across the trench 4, a floating p layer 10 in which no channel occurs is provided. On a rear surface side of the $n^-$-type semiconductor substrate 1, an $n^+$-type field stop layer 11, a p-type collector layer 12, and a collector electrode 13 are provided.

Figure 10:
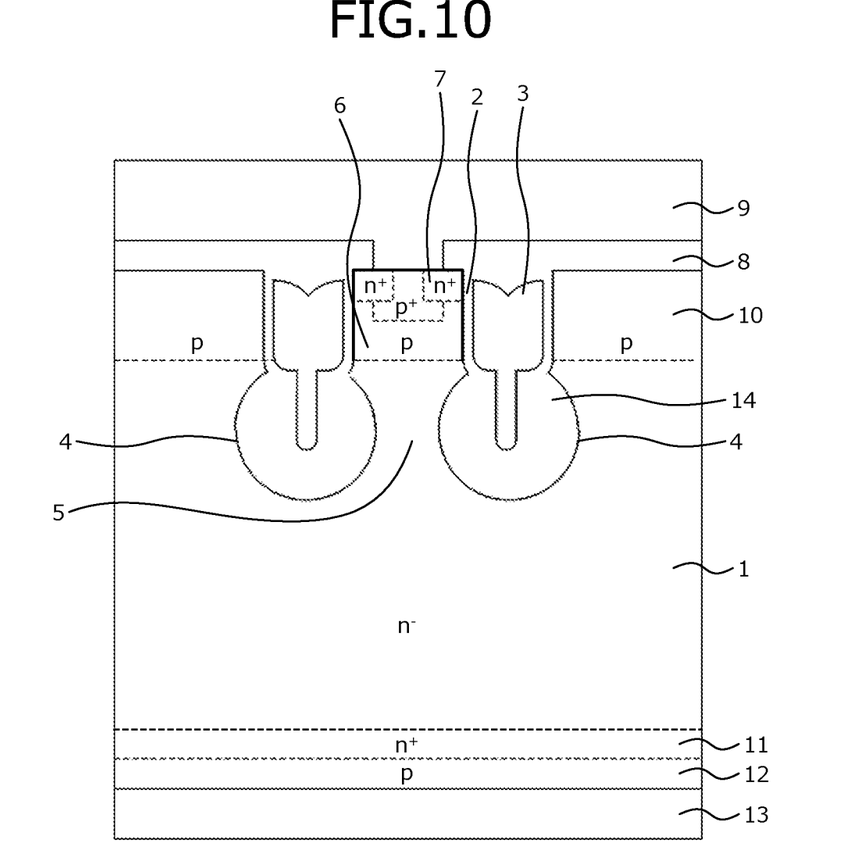
FIG. 10 is a cross-sectional view of an active portion of a conventional trench gate IGBT that enhances the IE effect.

FIG. 10 is a cross-sectional view of the active portion of a conventional trench gate IGBT that enhances the IE effect. As depicted in FIG. 10, compared to the conventional trench gate IGBT depicted in FIG. 9, the trench gate IGBT that enhances the IE effect has, at a lower half of the trench 4, an oxide film 14 that is thicker than the gate oxide film 2 of the upper half of the trench 4. As a result, the current density flowing in a region of the same concentration as that of the drift layer of the mesa portion 5 is enhanced, thereby enhancing the IE effect.

A known dummy gate type structure improves the Eon-dV/dt tradeoff and the controllability of the dV/dt at the time of turn-ON by Rg. In the dummy gate type structure, an emitter trench that becomes a dummy gate is filled with, for example, a poly-silicon in place of a gate electrode and near the dummy gate, an $n^+$ emitter region is provided (for example, refer to Japanese Laid-Open Patent Publication No. 2002-353456).

In the dummy gate type structure, during high voltage such as during the first half of turn-ON, a low resistance path along which hole current flows to the emitter electrode occurs consequent to the storage of holes along the emitter trench. As a result, rises in the potential of the floating portion may be suppressed whereby the Eon-dV/dt tradeoff and the controllability of the dV/dt at the time of turn-ON by Rg may be improved.

Another known structure includes a mixture of a trench gate structure and a planar structure in which a gate insulating film and a gate electrode extend in a horizontal direction. Since the source region and the emitter electrode on the planar structure side are not directly connected, no channel occurs on the planar structure side (for example, refer to Published Japanese-Translation of PCT Application, Publication No. 2013-522924). Consequently, without use of an emitter trench, the Eon-Rg tradeoff and the controllability of the dV/dt at the time of turn-ON by Rg may be improved.

Yet another known structure eliminates the floating p layer by providing in the entire mesa region, dummy trenches that contact each other or are sufficiently close to each other (for example, refer to International Publication No. 2011/111500). Elimination of the floating p layer enables the Eon-Rg tradeoff and the controllability of the dV/dt at the time of turn-ON by Rg to be improved.

SUMMARY OF THE INVENTION

According to one aspect of the present invention, a semiconductor device includes a semiconductor substrate of a first conductivity type; a first groove provided on a front surface side of the semiconductor substrate; a gate electrode formed of a conductor material filling the first groove; a first impurity region of a second conductivity type, provided so as to contact the first groove at the front surface side of the semiconductor substrate; a second impurity region of the first conductivity type, provided in a region of the first impurity region, near a surface of the first impurity region; a first insulating film provided between the first groove and the gate electrode, the first insulating film having a lower half portion that is thicker than an upper half portion contacting the first impurity region; a second groove provided on the front surface side of the semiconductor substrate; a second insulating film provided in the second groove, the second insulating film having a lower half portion that is thicker than an upper half portion; a third insulating film provided astride tops of the first groove and the second groove; an emitter electrode provided on the third insulating film, the emitter electrode being electrically connected to the first impurity region and the second impurity region; a third impurity layer of the second conductivity type, provided on a rear surface side of the semiconductor substrate; and a collector electrode provided on a surface of the third impurity layer. The lower half portion of the first insulating film and the lower half portion of the second insulating film are connected. The gate electrode has a first width at a first portion of the gate electrode contacting the lower half portion of the first insulating film, the first width being narrower than a second width at a second portion of the gate electrode 3 contacting the upper half portion of the first insulating film.

In the semiconductor device, a portion of the semiconductor substrate is included in a region surrounded by the first insulating film, the second insulating film, and the third insulating film.

In the semiconductor device, the portion of the semiconductor substrate surrounded by the first insulating film, the second insulating film, and the third insulating film has an impurity concentration that is a same as that of the first impurity region.

According to another aspect of the present invention, a method of manufacturing a semiconductor device includes forming an upper half portion of a first groove and an upper half portion of a second groove in a semiconductor substrate of a first conductivity type; covering a side of the first groove and a side of the second groove with a nitride film; using the nitride film as a mask to perform anisotropic etching and form at a bottom of the upper half portion of the first groove and at a bottom of the upper half portion of the second groove, respectively, a lower half portion of the first groove and a lower half portion of the second groove, respectively, narrower than the upper half portion of the first groove and the upper half portion of the second groove; using the nitride film as a mask to perform an oxidation process and produce an oxide film in respective peripheries of the lower half portion of the first groove and the lower half portion of the second groove, and connect the oxide film of the periphery of the lower half portion of the first groove and the oxide film of the periphery of the lower half portion of the second groove; and removing the nitride film, and filling the upper half portion of the first groove and the lower half portion of the first groove with a conductor material.

Objects, features, and advantages of the present invention are specifically set forth in or will become apparent from the following detailed description of the invention when read in conjunction with the accompanying drawings.

DETAILED DESCRIPTION OF THE INVENTION

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. Depending on the structure that is optimal, the concentrations may be reversed. In the description of the embodiments below and the accompanying drawings, portions that are identical will be given the same reference numerals and will not be repeatedly described.

Figure 1:
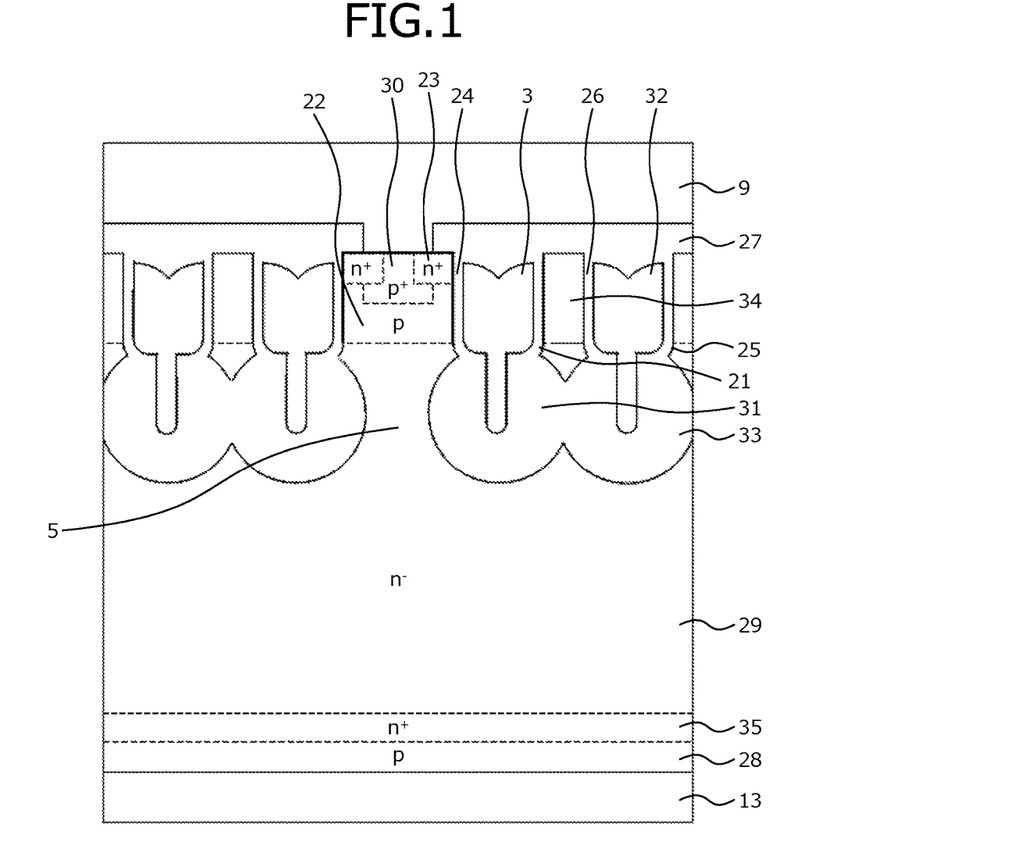
FIG. 1 is a cross-sectional view of an active portion of a semiconductor device according to an embodiment.

FIG. 1 is a cross-sectional view of an active portion of the semiconductor device according to an embodiment. As depicted in FIG. 1, the semiconductor device is a trench gate IGBT. The trench gate IGBT has a first groove (trench) 21, the gate electrode 3, a first impurity region 22 of a p-type, a second impurity region 23 of an n-type, a first insulating film 24, a second groove (trench) 25, a second insulating film 26, a third insulating film 27, the emitter electrode 9, a third impurity layer 28 of a p-type, and the collector electrode 13.

The first groove 21 is provided on a front surface side of a semiconductor substrate 29 of a first conductivity type, e.g., an n-type, formed by silicon. The second groove 25 is provided on the front surface side of the semiconductor substrate 29. The first groove 21 and the second groove 25 are provided separated from each other.

Here, although not particularly limited, the conductivity type of the semiconductor substrate 29, for example, is assumed to an n-type. The semiconductor substrate 29, for example, becomes an n⁻ drift layer.

The gate electrode 3 is formed by a conductor material and fills the first groove 21. The conductor material, for example, may be a poly-silicon. The gate electrode 3 has a width at a portion of the gate electrode 3 contacting a lower half portion 31 of the first insulating film 24, narrower than a width at a portion of the gate electrode 3 contacting an upper half portion of the first insulating film 24 described hereinafter. As a result, capacitance between the gate and drain may be reduced, enabling the dV/dt-Rg tradeoff and turn-ON controllability by Rg to be further improved.

The first impurity region 22 is provided so as to contact the first groove 21 at the front surface side of the semiconductor substrate 29. In a region of the first impurity region 22, near a surface thereof, a p⁺ impurity region 30 is provided.

The second impurity region 23 is provided in a region of the first impurity region 22 near a surface the first impurity region 22. The second impurity region 23 is provided contacting the first groove 21. The second impurity region 23 is provided contacting the p⁺ impurity region 30.

The first insulating film 24 is provided between the first groove 21 and the gate electrode 3. The first insulating film 24 becomes a gate insulating film. The first insulating film 24 may be formed by an oxide film. The first insulating film 24 is thicker at the lower half portion 31 contacting the mesa portion 5 on the lower side of the first impurity region 22 than at an upper half portion contacting the first impurity region 22.

The second groove 25, for example, is filled with a poly-silicon 32. The poly-silicon 32 may have a width at a portion contacting a lower half portion 33 of the second insulating film 26 narrower than a width at a portion contacting an upper half portion of the second insulating film 26 described hereinafter. The poly-silicon 32 in the second groove 25 has a potential that may be set to be the same potential as that of the gate electrode 3. Alternatively, the potential of the poly-silicon in a portion of the second groove 25 may be set to be the emitter potential.

The second insulating film 26 is provided between the second groove 25 and the poly-silicon 32 in the second groove 25. The second insulating film 26 may be formed by an oxide film. The second insulating film 26, similar to the first insulating film 24, is thicker at the lower half portion 33 than at the upper half portion.

The third insulating film 27 is provided astride tops of the first groove 21 and on the second groove 25. The third insulating film 27 may be formed by an oxide film.

The lower half portion 31 of the first insulating film 24 and the lower half portion 33 of the second insulating film 26 are connected. A portion of the semiconductor substrate 29 may be included in an encompassed region 34 surrounded by the upper half portion and the lower half portion 31 of the first insulating film 24, the upper half portion and the lower half portion 33 of the second insulating film 26, and the third insulating film 27. As a result, the gate-source capacitance may be increased, enabling the dV/dt-Rg tradeoff and turn-ON controllability by Rg to be further improved.

Further, the portion of the semiconductor substrate 29 included in the encompassed region 34 may have an impurity concentration that is the same as that of the first impurity region 22. As a result, manufacturing processes may be shortened, thereby enabling cost to be reduced. The encompassed region 34 may serve as a potentially floated floating p layer. Alternatively, the potential of the encompassed region 34 may be the source potential.

The emitter electrode 9 is provided on the third insulating film 27. The emitter electrode 9 is connected to the second impurity region 23 and the p⁺ impurity region 30 via a contact hole provided in the third insulating film 27. The emitter electrode 9 is electrically connected to the first impurity region 22 and the second impurity region 23.

The third impurity layer 28 is provided on the rear surface side of the semiconductor substrate 29. An n⁺ field stop layer 35 may be provided between the semiconductor substrate 29 and the third impurity layer 28. The collector electrode 13 is provided on a surface of the third impurity layer 28.

Figure 2:
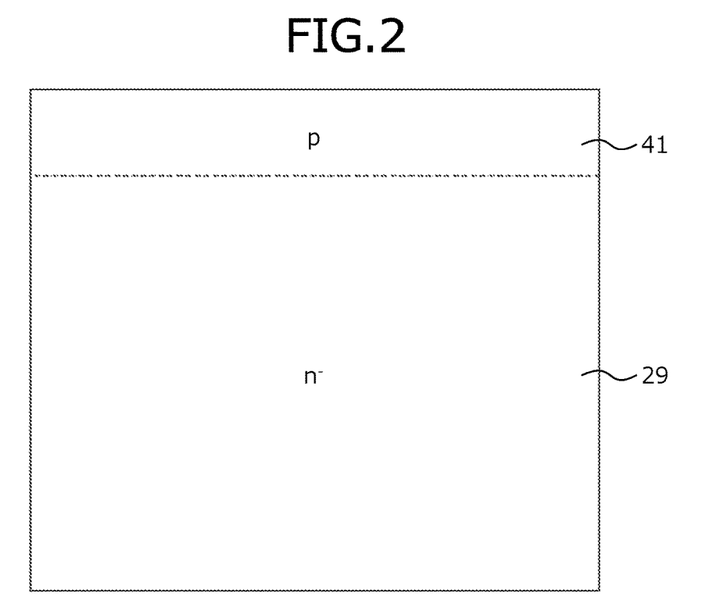
FIG. 2 is a cross-sectional view of the semiconductor device depicted in FIG. 1 during manufacture.
Figure 3:
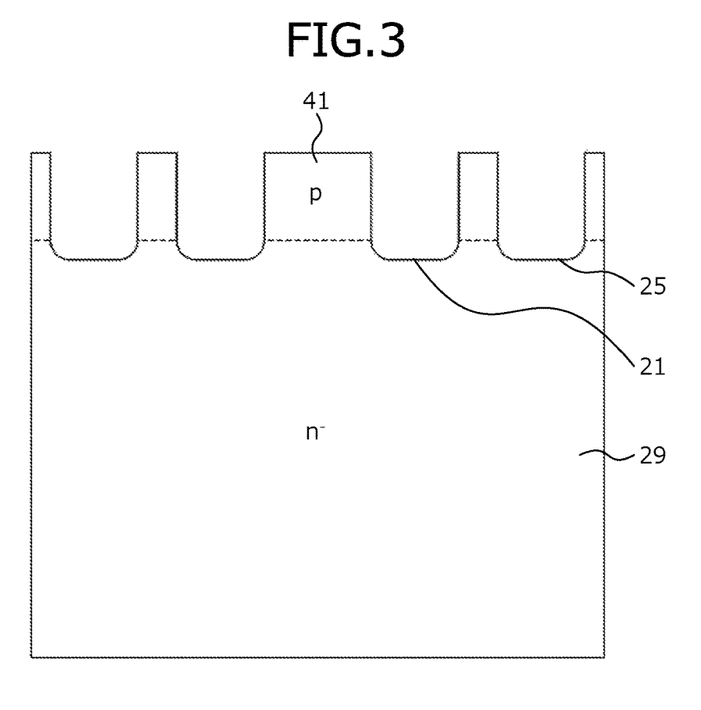
FIG. 3 is a cross-sectional view of the semiconductor device subsequent to that of FIG. 2.
Figure 4:
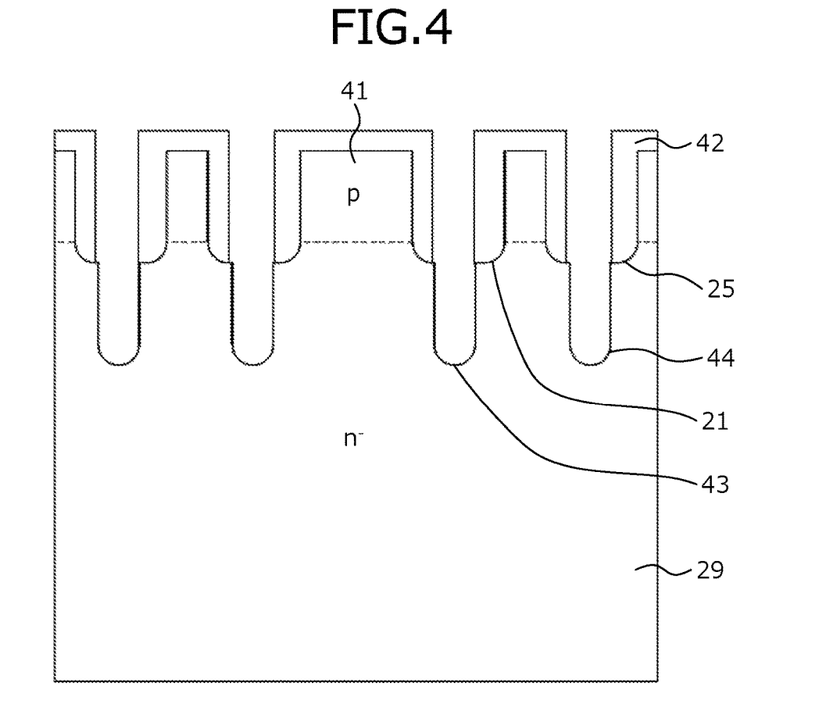
FIG. 4 is a cross-sectional view of the semiconductor device subsequent to that of FIG. 3.
Figure 5:
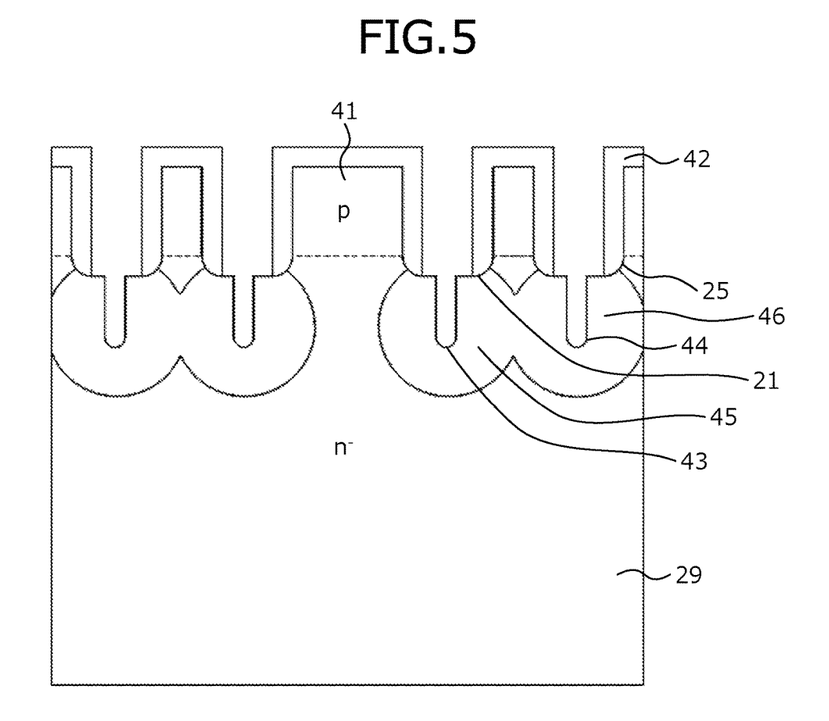
FIG. 5 is a cross-sectional view of the semiconductor device subsequent to that of FIG. 4.
Figure 6:
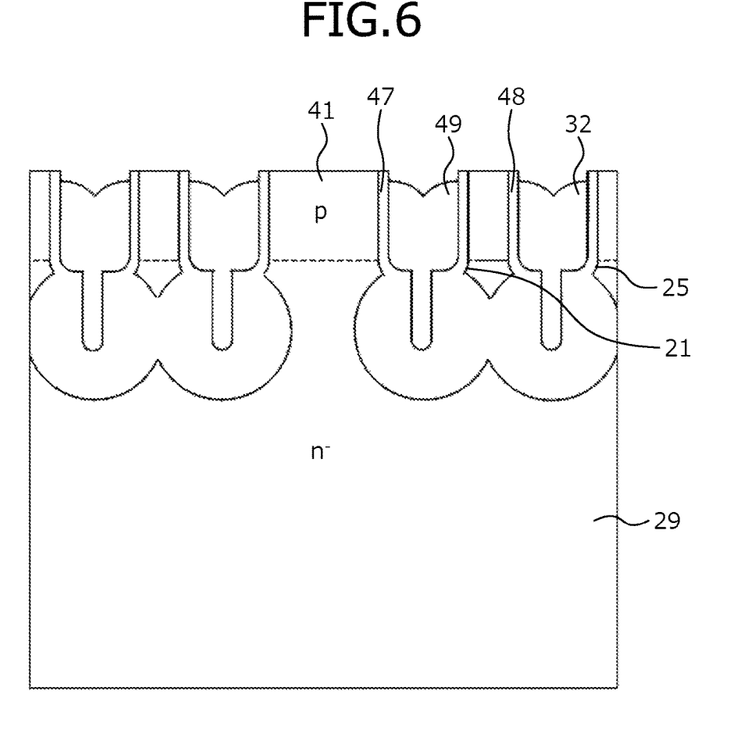
FIG. 6 is a cross-sectional view of the semiconductor device subsequent to that of FIG. 5.

FIG. 2 is a cross-sectional view of a state of the semiconductor device depicted in FIG. 1 during manufacture. FIG. 3 is a cross-sectional view subsequent to that of FIG. 2. FIG. 4 is a cross-sectional view subsequent to that of FIG. 3. FIG. 5 is a cross-sectional view subsequent to that of FIG. 4. FIG. 6 is a cross-sectional view subsequent to that of FIG. 5.

First, as depicted in FIG. 2, for example, boron is ion implanted in, for example, the front surface of the semiconductor substrate 29 of an n-type. Next, activation annealing is performed, forming a p-type layer 41 on the front surface side of the semiconductor substrate 29. The p-type layer 41 becomes the first impurity region 22 and the encompassed region 34 having the same impurity concentration as that of the first impurity region 22.

Next, as depicted in FIG. 3, an oxide film is formed on a surface of the p-type layer 41 and photolithography and etching are performed, removing a portion of the oxide film. The remaining oxide film is used as a mask to perform anisotropic dry etching and form the first groove 21 and the second groove 25. For example, in the case of a 1200V device, the respective widths of the first groove 21 and the second groove 25 at this stage, for example, may be about 0.1 μm or more and 1.5 μm or less, and the respective depths thereof, for example, may be about 0.5 μm or more and 3.0 μm or less. Further, an interval between the first groove 21 and the second groove 25 and an interval between adjacent second grooves 25 may be narrow intervals of about 0.1 μm or more and 2.0 μm or less, for example.

Next, as depicted in FIG. 4, a nitride film 42 is deposited on the front surface side of the semiconductor substrate 29. Subsequently, photolithography and etching are performed, removing the nitride film at bottoms of the first groove 21 and the second groove 25.

The nitride film 42 remaining on side wall portions of the first groove 21 and the second groove 25 is used as a mask to perform silicon etching and form at the bottom of the first groove 21 a deeper groove 43 and at the bottom of the second groove 25, a deeper groove 44. For example, in the case of a 1200V device, the groove 43 deeper than the first groove 21 and the groove 44 deeper than the second groove 25 have widths that may be, for example, about 0.05 μm or more and 1.0 μm or less, and have depths that may be, for example, about 0.5 μm or more and 3.0 μm or less from the bottom of the first groove 21 and from the bottom of the second groove 25, respectively.

Next, as depicted in FIG. 5, sacrificial oxidation of areas not covered by the nitride film 42 is performed. Next, an oxide film 45 produced surrounding the groove 43 that is deeper than the first groove 21 and an oxide film 46 produced surrounding the groove 44 that is deeper than the second groove 25 are connected. Further, when the second grooves 25 are provided adjacent to each other, the oxide films 46 produced surrounding the grooves 44 that are deeper than the second grooves 25 are connected. The oxide film 45 produced surrounding the deep groove 43 becomes the lower half portion 31 of the first insulating film 24. The oxide film 46 produced surrounding the deep groove 44 becomes the lower half portion 33 of the second insulating film 26.

After the nitride film 42 is peeled, as depicted in FIG. 6, thermal oxidation is performed, forming a gate oxide film 47 at the side wall portion of the first groove 21 and an oxide film 48 at the side wall portion of the second groove 25. The gate oxide film 47 at the side wall portion of the first groove 21 becomes the upper half portion of the first insulating film 24. The oxide film 48 at the side wall portion of the second groove 25 becomes the upper half portion of the second insulating film 26.

Next, poly-silicon is deposited on the front surface side of the semiconductor substrate 29 and etched, filling the first groove 21 with a poly-silicon 49 and filling the second groove 25 with the poly-silicon 32. The poly-silicon 49 in the first groove 21 becomes the gate electrode 3.

Next, as depicted in FIG. 1, photolithography, ion implantation of boron, and activation annealing are performed, forming the $p^+$ impurity region 30. Next, photolithography, ion implantation of arsenic, and activation annealing are performed, forming the second impurity region 23.

Next, by a chemical vapor deposition (CVD) method, on the front surface side of the semiconductor substrate 29, an oxide film that becomes the third insulating film 27 is deposited, having a thickness of, for example, 0.1 μm or more and 6.0 μm or less. Next, a contact hole is formed in the third insulating film 27 by photolithography and etching. Next, aluminum is deposited on the front surface side of the semiconductor substrate 29 and the emitter electrode 9 is formed by photolithography and etching.

Next, a resist is applied to the front surface of the semiconductor substrate 29, protecting element structures on the front surface side of the semiconductor substrate 29. Next, polishing and etching of the substrate rear surface is performed so that the silicon thickness becomes a predetermined thickness. For example, in the case of a 1200V device, the predetermined silicon thickness, for example, may be about 100 μm or more and 140 μm or less.

Next, for example, phosphorus, selenium, or protons are ion implanted in the rear surface of the semiconductor substrate 29 and activation annealing is performed, forming the $n^+$ field stop layer 35. Next, for example, boron is ion implanted in the rear surface of the semiconductor substrate 29, forming the third impurity layer 28 that becomes a collector layer. Next, the collector electrode 13 is formed on a surface of the third impurity layer 28. The wafer is cut, completing the IGBT chips.

According to the embodiment, beneath the encompassed region 34, the lower half portion 31 of the first insulating film 24 and the lower half portion 33 of the second insulating film 26 are continuous thereby, enabling the breakdown voltage to be secured and, the dV/dt-Rg tradeoff and the turn-ON controllability by Rg to be improved. Further, in the mesa portion 5, since the lower half portion 31 of the first insulating film 24 is thick, the resistance of hole current is raised, enabling the IE effect to be enhanced. Further, in the manufacturing processes, thin Si pillars need to be formed and therefore, advanced manufacturing technology is not necessary. Thus, both enhancement of the IE effect and improvement of the dV/dt-Rg tradeoff and controllability of turn-ON by Rg in an IGBT may be achieved by a simple manufacturing process.

Further, according to the embodiment, the potential of the poly-silicon 32 in the second groove 25 is the same as that of the gate electrode 3, enabling collector-floating portion capacitance to be reduced whereby the dV/dt-Rg tradeoff and the turn-ON controllability by Rg may be further improved. Alternatively, the potential of a portion of poly-silicon in the second groove 25 is the emitter potential whereby input capacitance may be increased.

Further, according to the embodiment, the potential of the encompassed region 34 is the source potential, enabling the gate-source capacitance Cgs to be increased whereby ringing may be suppressed.

A 1200V IGBT produced according to the method of manufacturing a semiconductor device described above is taken as an example. Meanwhile, for comparison, a 1200V IGBT of the conventional structure depicted in FIG. 9 is taken as a conventional example.

Figure 7:
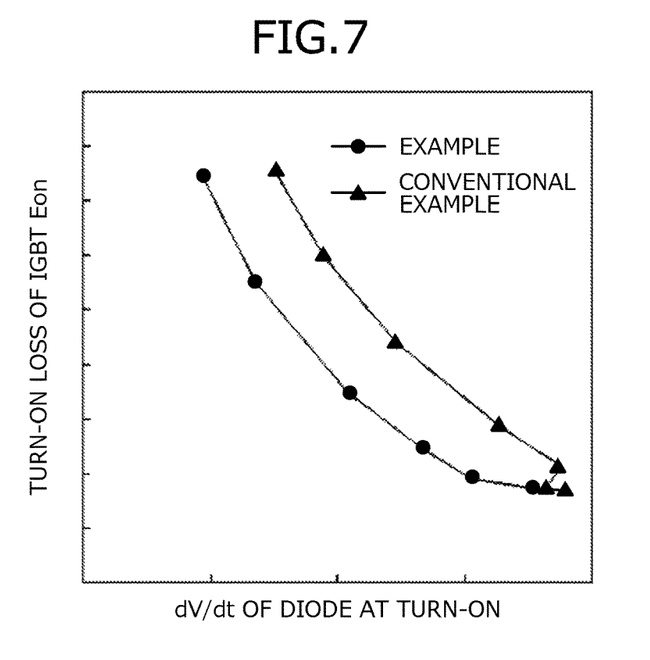
FIG. 7 is a characteristics diagram depicting the relationship of IGBT turn-ON loss Eon and diode dV/dt at the time of turn-ON when gate resistance Rg is varied in an example and a conventional example.
Figure 8:
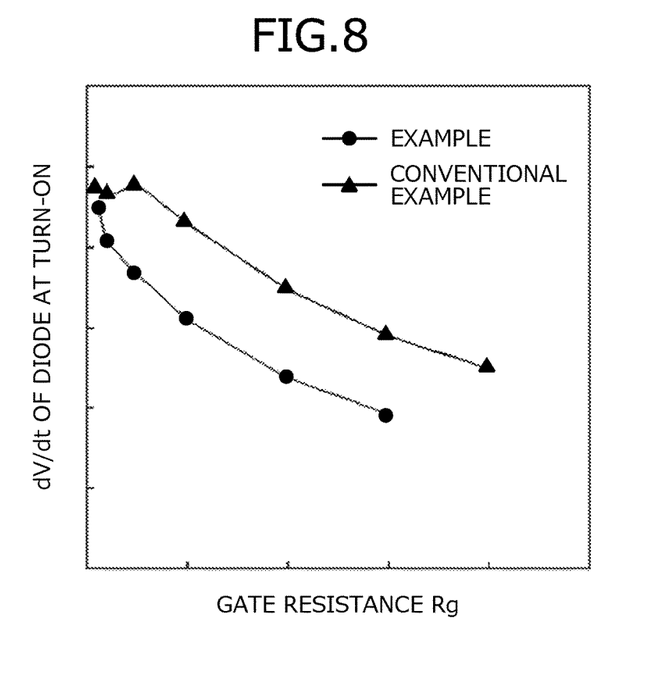
FIG. 8 is a characteristics diagram depicting variation of diode dV/dt at the time of turn-ON when the gate resistance Rg is varied in the example and the conventional example.

FIG. 7 is a characteristics diagram depicting the relationship of IGBT turn-ON loss Eon and diode dV/dt at the time of turn-ON when the gate resistance Rg is varied in the example and the conventional example. In FIG. 7, the vertical axis represents the IGBT turn-ON loss Eon and the horizontal axis represents the diode dV/dt at the time of turn-ON. Further, FIG. 8 is a characteristics diagram depicting variation of the diode dV/dt at the time of turn-ON when the gate resistance Rg is varied in the example and the conventional example. In FIG. 8, the vertical axis represents the diode dV/dt at the time of turn-ON and the horizontal axis represents the gate resistance Rg.

As clearly indicated in FIGS. 7 and 8, the IGBT of the example, as compared to the IGBT of the conventional example, was able to achieve both improvement of the IGBT dV/dt-Rg tradeoff and the turn-ON controllability by Rg, and enhancement of the IE effect. Furthermore, enhancement of the IE effect enabled the ON voltage Von of the IGBT to be reduced.

The present invention is not limited to the embodiment described above and the may be variously modified. For example, dimensions, concentrations, and the like described in the embodiment are one example and the present invention is not limited to these values. Further, in the embodiment, the first conductivity type is assumed to be an n-type and the second conductivity type is assumed to be a p-type. However, the invention is further implemented when the first conductivity type is a p-type and the second conductivity type is an n-type.

On the other hand, in the conventional structures depicted in FIG. 9 and FIG. 10, hole current flows in the floating p layer at the time of turn-ON. As a result, the potential of the floating p layer rises and displacement current flows to the gate, determining the turn-ON speed for the time period concerning the dV/dt, arising in a problem in that controllability becomes poor.

Further, when the mesa portion is reduced in size, input capacitance becomes extremely small, arising in a problem in that compatibility of the conventional structure and external circuits becomes poor. On the other hand, in the dummy gate type structure, even during low voltage such as the ON state, holes are easily stored in the emitter trench compared to the gate trench and the resistance of hole current passing through the mesa portion decreases, arising in a problem in that the IE effect decreases, leading to increases of the ON voltage Von.

Further, when a trench gate structure and a planar structure are both present, a low resistance path of the hole current at the time of turn-ON is not actively used and therefore, a problem arises in that compared to the dummy gate type structure, the IE effect is easily impaired and a balance of the ON voltage Von and the Eon-Rg tradeoff is difficult to achieve. Further, in the structure that eliminates the floating p layer by the close dummy trenches, when the emitter trench is formed, thin Si pillars that that can disappear with sacrificial oxidation have to be formed, arising in a problem in that advanced manufacturing technology is necessary.

According to the present invention, in a floating portion in which no channel occurs, a thick insulating film of the trench bottom is continuous with the thick insulator film of a neighbor trench bottom, enabling the breakdown voltage to be secured without a p-type layer in the floating portion and enabling the dV/dt-Rg tradeoff and the turn-ON controllability by Rg to be improved. In the mesa portion, the insulation film of the trench bottom, contacting the drift layer is thick whereby the resistance of hole current is raised, enabling the IE effect to be enhanced.

According to the present invention, capacitance between the gate and drain may be reduced, enabling the dV/dt-Rg tradeoff and turn-ON controllability by Rg to be further improved.

According to the present invention, gate-source capacitance may be increased, enabling the dV/dt-Rg tradeoff and turn-ON controllability by Rg to be further improved.

According to the present invention, manufacturing processes may be shortened, thereby enabling cost to be reduced.

According to the present invention, thin Si pillars need not be formed and therefore, advanced manufacturing technology is not necessary.

According to the semiconductor device and the method of manufacturing a semiconductor device according to the present invention, both enhancement of the IE effect and improvement of the dV/dt-Rg tradeoff and controllability of turn-ON by Rg in an IGBT may be achieved by a simple manufacturing process.

As described, the semiconductor device and the method of manufacturing a semiconductor device according to the present invention are useful in power semiconductor devices and are particularly suitable for IGBTs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a semiconductor substrate of a first conductivity type, having a front surface side and a rear surface side;
    a first groove provided on the front surface side of the semiconductor substrate;
    a gate electrode of a conductor material, provided in the first groove;
    a first impurity region of a second conductivity type, provided at the front surface side of the semiconductor substrate;
    a second impurity region of the first conductivity type, provided in the first impurity region;
    a first insulating film provided between the first groove and the gate electrode, the first insulating film having an upper half portion contacting the first impurity region, and a lower half portion that is thicker than the upper half portion;
    a second groove provided on the front surface side of the semiconductor substrate;
    a second insulating film provided in the second groove, the second insulating film having an upper half portion, and a lower half portion that is thicker than the upper half portion thereof;
    a third insulating film provided astride tops of the first groove and the second groove;
    an emitter electrode provided on the third insulating film, the emitter electrode being electrically connected to the first impurity region and the second impurity region;
    a third impurity layer of the second conductivity type, provided on the rear surface side of the semiconductor substrate; and
    a collector electrode provided on an rear surface of the third impurity layer, wherein
    the lower half portion of the first insulating film and the lower half portion of the second insulating film are connected to each other, and
    a first portion of the gate electrode contacts the lower half portion of the first insulating film, and a second portion of the gate electrode contacts the upper half portion of the first insulating film, a width of the first portion being narrower than a width of the second portion.

2. The semiconductor device according to claim 1, wherein
    a portion of the semiconductor substrate is included in a region surrounded by the first insulating film, the second insulating film and the third insulating film.

3. The semiconductor device according to claim 2, wherein
    an impurity concentration of the portion of the semiconductor substrate equals to that of the first impurity region.

* * * * *